(12) United States Patent
Kao et al.

(10) Patent No.: US 7,845,393 B2
(45) Date of Patent: Dec. 7, 2010

(54) THERMAL MODULE

(75) Inventors: Ying Hong Kao, Tainan (TW); Emily Hsiao, Tainan (TW)

(73) Assignee: Jiing Tung Tec. Metal Co., Ltd., Tainan (TW)

(*) Notice: Subject to any disclaimer, the term of this patent is extended or adjusted under 35 U.S.C. 154(b) by 438 days.

(21) Appl. No.: 11/979,564

(22) Filed: Nov. 6, 2007

(65) Prior Publication Data
US 2009/0117316 A1 May 7, 2009

(51) Int. Cl.
*H05K 7/20* (2006.01)
(52) U.S. Cl. .................. 165/80.3; 361/704; 165/185
(58) Field of Classification Search .............. 165/80.3, 165/185; 361/704, 710; 257/720
See application file for complete search history.

(56) References Cited

U.S. PATENT DOCUMENTS

| 3,457,988 | A | * | 7/1969 | Stewart et al. ............. 165/80.3 |
| 4,688,077 | A | * | 8/1987 | Wakabayashi et al. ...... 257/713 |
| 5,313,333 | A | * | 5/1994 | O'Brien et al. ............. 359/820 |
| 6,253,452 | B1 | * | 7/2001 | Chen et al. ............... 29/890.05 |
| 6,450,250 | B2 | * | 9/2002 | Guerrero ............... 165/104.33 |
| 6,519,150 | B1 | * | 2/2003 | Chen et al. ................... 361/697 |
| 6,927,979 | B2 | * | 8/2005 | Watanabe et al. ........... 361/697 |
| 6,937,473 | B2 | * | 8/2005 | Cheng et al. ................ 361/704 |
| 7,283,362 | B2 | * | 10/2007 | Lin et al. .................... 361/704 |
| 7,443,683 | B2 | * | 10/2008 | Searby ....................... 361/710 |
| 7,637,635 | B2 | * | 12/2009 | Xiao et al. .................. 362/294 |
| 2003/0116312 | A1 | * | 6/2003 | Krassowski et al. ......... 165/185 |
| 2004/0031588 | A1 | * | 2/2004 | Makaran ..................... 165/80.3 |
| 2005/0128710 | A1 | * | 6/2005 | Beitelmal et al. ........... 361/709 |
| 2005/0211416 | A1 | * | 9/2005 | Kawabata et al. .......... 165/80.3 |
| 2006/0213642 | A1 | * | 9/2006 | Lai ............................ 165/80.3 |
| 2006/0290891 | A1 | * | 12/2006 | Wang et al. .................. 353/52 |

\* cited by examiner

*Primary Examiner*—Allen J Flanigan
(74) *Attorney, Agent, or Firm*—Guice Patents PLLC

(57) ABSTRACT

A thermal module includes a body press-forged from magnesium alloy that is heated to a softened status and having a peripheral wall and a recessed chamber surrounded by the peripheral wall, and a contact surface member prepared from a high thermal conductivity metal material and bonded to the recessed chamber of the body during press-forging of the body.

8 Claims, 7 Drawing Sheets

THERMAL MODULE

BACKGROUND OF THE INVENTION

1. Field of the Invention

The present invention relates to thermal modules and more particularly, to a high-performance thermal module directly press-forged from magnesium alloy and copper alloy. By means of press-forging, the cohesive energy density of the thermal module is high, and therefore the thermal module can be covered with a layer of metal coating by means of electroplating, improving beauty and quality.

2. Description of the Related Art

Despite of different design changes, conventional lighting fixtures use a lamp bulb or lamp tube to produce light. These conventional lighting fixtures have the common drawbacks of high consumption of electric energy and production of heat. The production of heat not only shortens the service life of the lighting fixture but also increases the ambient temperature. Further, a daylight lamp causes a flashing problem that is harmful to the eyes.

Nowadays, LEDs (light emitting diodes) have been intensively used in lighting fixtures to substitute for conventional lamp bulbs and tubes for the advantages of low power consumption and long service life. Further, because LEDs do not contain mercury, using LEDs for lighting fixture brings no harm to environment.

However, LEDs may be too dim in bright light situations because of its unidirectional lighting feature. Therefore, a LED lighting fixture has the drawback of limited angle of illumination. To overcome this problem, multiple LEDs may be arranged together and set in different angles. However, this arrangement greatly complicates the fabrication of the lighting fixture and will also increase the cost. Further, LEDs still produce heat during operation. The problem of heat will affect the brightness of LEDs and their service life.

Various thermal modules have been disclosed for use with LEDs to dissipate heat during operation of LEDs. Conventional thermal modules for this purpose are commonly extruded from aluminum alloy. Radiation fins may be provided to enhance heat dissipation. However, the heat dissipation effect of conventional thermal modules extruded from aluminum alloy is still not perfect. Currently, many thermal modules are known prepared from composition metal for use in electronic products. Taiwan Patent Publication Number 563846 is an exemplar. However, no composition metal type thermal module is known for use with a LED module.

Commercial composition type thermal modules commonly use aluminum for dissipating heat and copper for absorbing heat and transferring absorbed heat to aluminum for dissipation.

However, these composition type thermal modules are not ideal designs for the products that require EMI (electromagnetic interference) protection.

Further, following the market tendency toward light and small characteristics and the world's environmental protection trend, magnesium alloy has become the material market's favorite. Magnesium alloy has light characteristic. Further, magnesium alloy has excellent strength-to-weight ratio, high stiffness, excellent impact-resistance and wear-resistance capability, and magnetic wave absorbing and shock absorbing characteristics. Nowadays, magnesium alloy is intensively used in computer, communication and consumer electronic products.

There are manufacturers trying to use magnesium alloy for making thermal modules. However, magnesium alloy has the drawback of low flowability. Conventionally, casting and injection molding techniques are employed to fabric thermal modules from magnesium alloy. However, casting technique is not practical for making a magnesium alloy product having a thin wall. Making thermal modules from magnesium alloy by casting may encounter the problems of thermal cracking, oxidization, insufficient strength, deformation of the product upon ejection from the mold, and insufficient tightness that affect heat dissipation performance.

Further, unlike the application history of aluminum that is over several hundred years, magnesium is a new application material developed in last few decades. In the early stage, thermal module manufacturers are not familiar with the nature of magnesium. It is difficult and dangerous to process magnesium. It is almost impossible to make a composition type thermal module by using magnesium. Because magnesium is a hazardous metal tend to react with oxygen, molten magnesium will burn under an oxygen environment. When burning magnesium is covered with water, it will generate hydrogen and may explode. Therefore, it is difficult to fabricate a composition thermal module using magnesium.

SUMMARY OF THE INVENTION

The present invention has been accomplished under the circumstances in view. According to the experience of the present inventor in metal forging to press-forge metal products from gold, silver, copper, aluminum, magnesium, and etc., magnesium alloy workpiece is cooling faster than aluminum alloy workpiece during forging, and the uniformity and tightness of crystal phase structure of magnesium alloy after forging are greatly improved. It is therefore the main object of the present invention to provide a thermal module, which has a uniform and tight crystal phase structure and excellent heat dissipation efficiency. It is another object of the present invention to provide a thermal module, which has a high cohesive energy density and can be covered with a layer of metal coating by means of electroplating to improve beauty and quality.

To achieve these and other objects of the present invention, the thermal module comprises a body and a contact surface member. The body is press-forged from magnesium alloy that is heated to a softened status. Further, the body comprises a peripheral wall, and a recessed chamber surrounded by the peripheral wall. The contact surface member is prepared from a high thermal conductivity metal material and bonded to the inside of the body during press-forging of the body.

DETAILED DESCRIPTION OF THE PREFERRED EMBODIMENT

Referring to FIGS. 1~7, a thermal module is shown comprising a body 1 and a contact surface member 2. The body 1 has a peripheral wall 11 and a recessed chamber 12 surrounded by the peripheral wall 11. The body 1 is made of magnesium alloy by means of softening magnesium alloy with heat and then press forging softened magnesium alloy into the desired shape. The contact surface member 2 is prepared from a metal alloy of high thermal conductivity, and bonded to the inside of the body 1. The metal alloy can be gold alloy, platinum alloy, silver alloy, or copper alloy.

Figure 3:
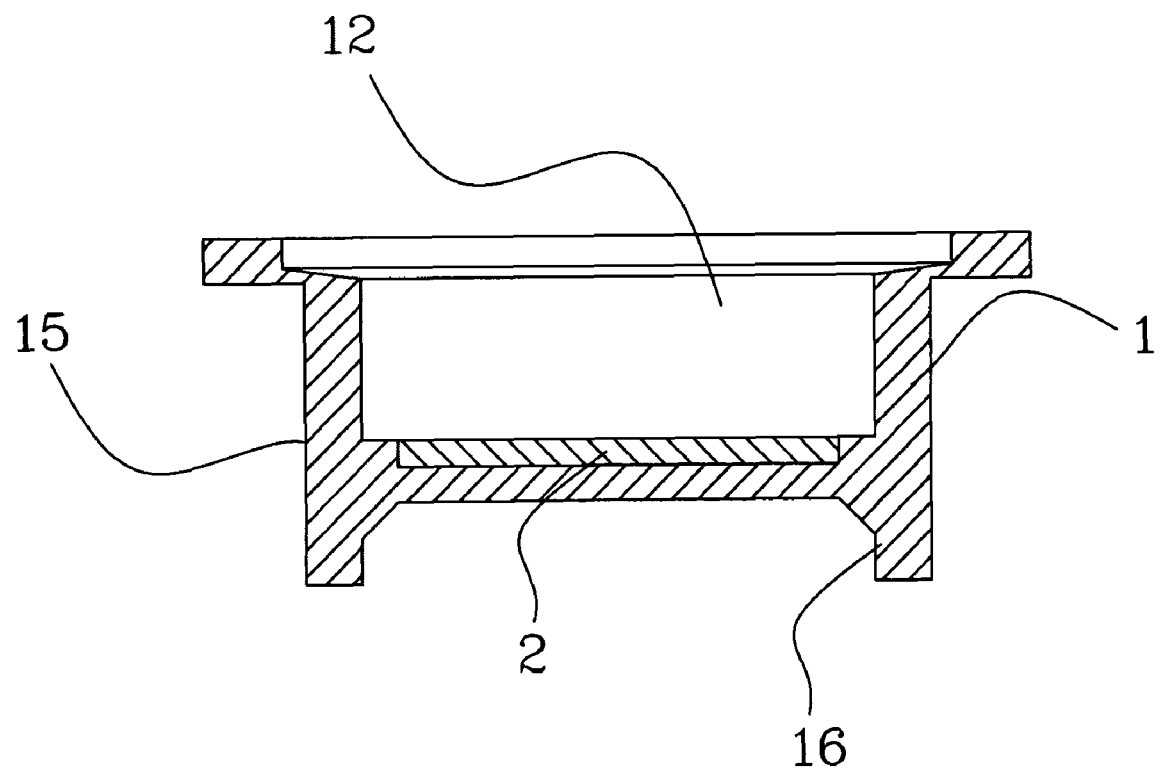
FIG. 3 is a sectional view of the thermal module in accordance with the present invention.
Figure 4:
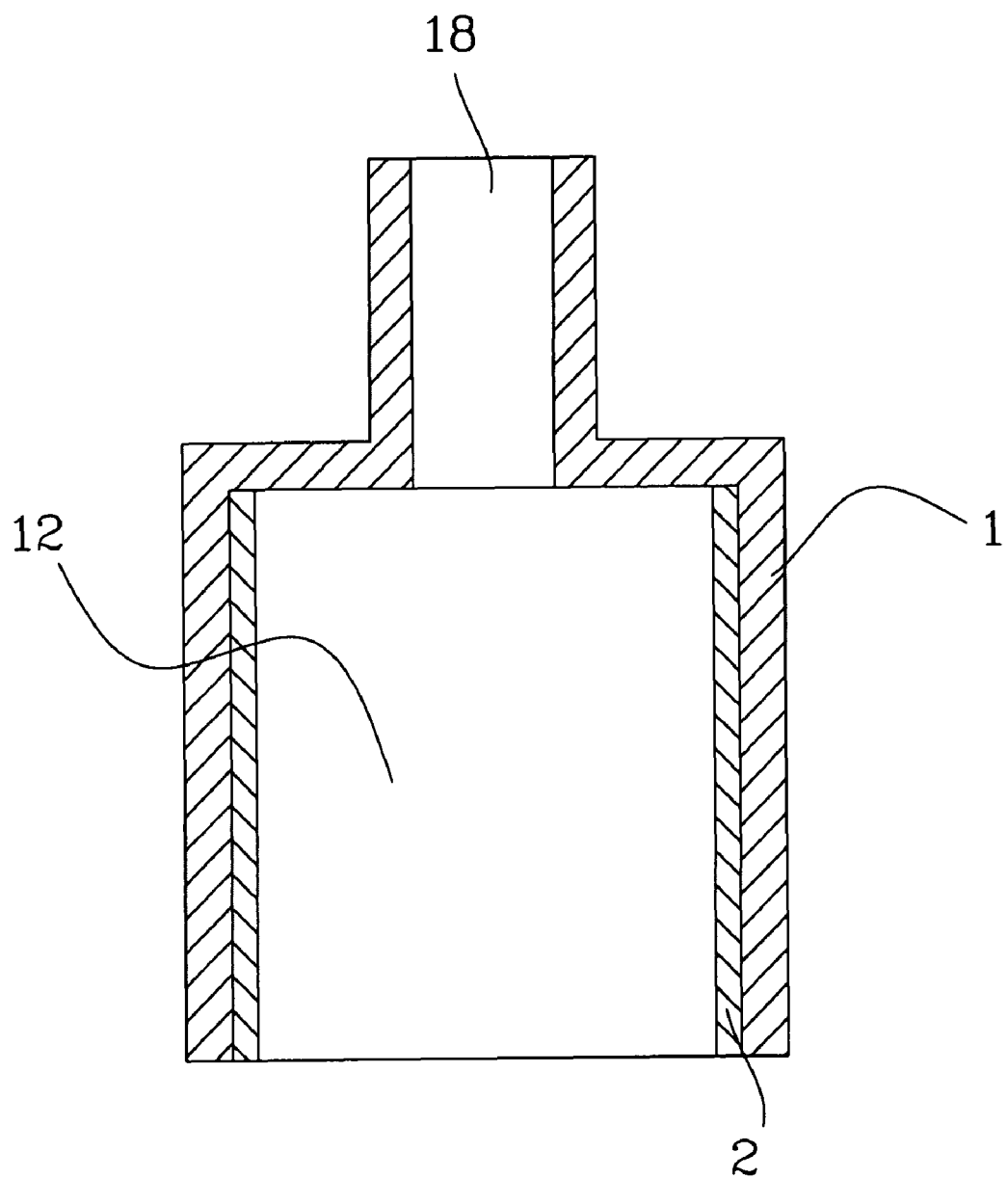
FIG. 4 is a sectional of an alternate form of the thermal module in accordance with the present invention.

The contact surface member 2 can be, as shown in FIG. 3, a tabular member made of copper alloy and bonded to the bottom wall of the body 1 inside the recessed chamber 12. In an alternate form of the present invention, as shown in FIG. 4, the contact surface member 2 is a circular member made of copper alloy and bonded to the inside wall of the recessed chamber 12 in vertical.

Figure 1:
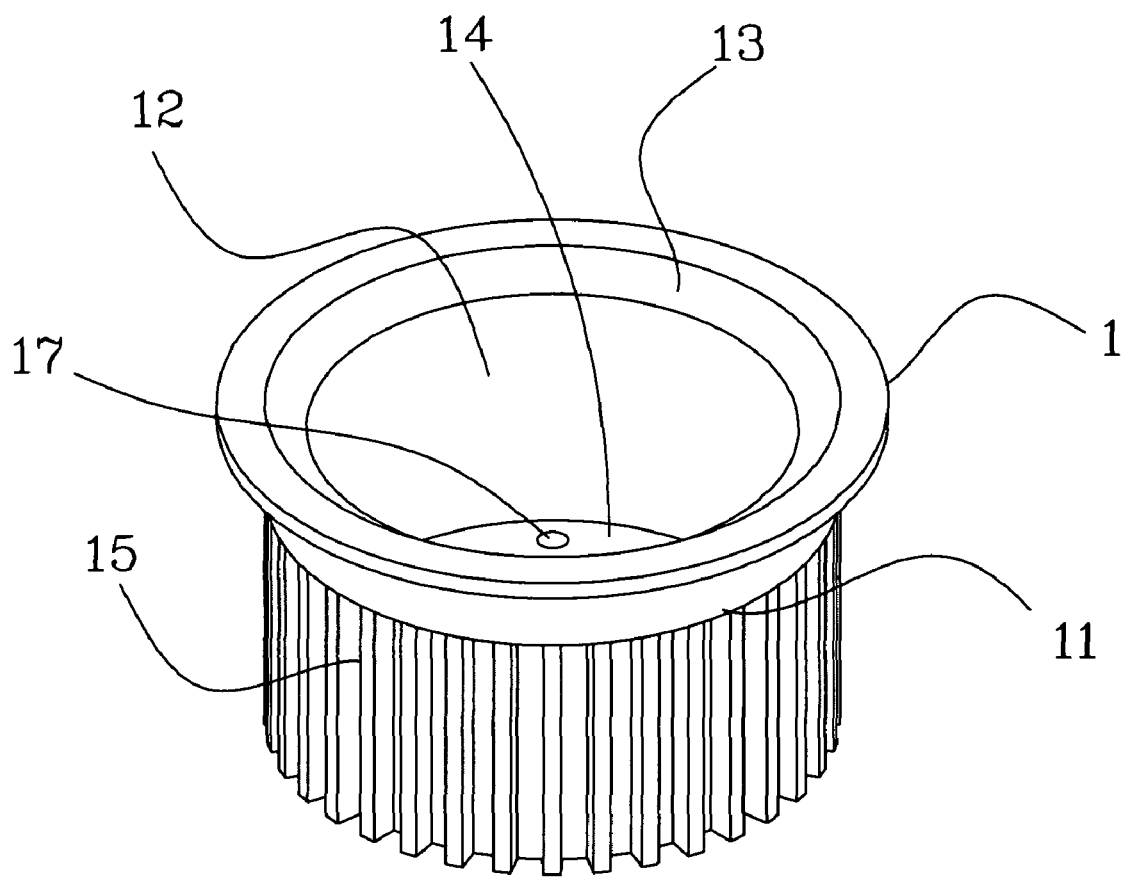
FIG. 1 is an oblique elevation of a thermal module in accordance with the present invention.
Figure 2:
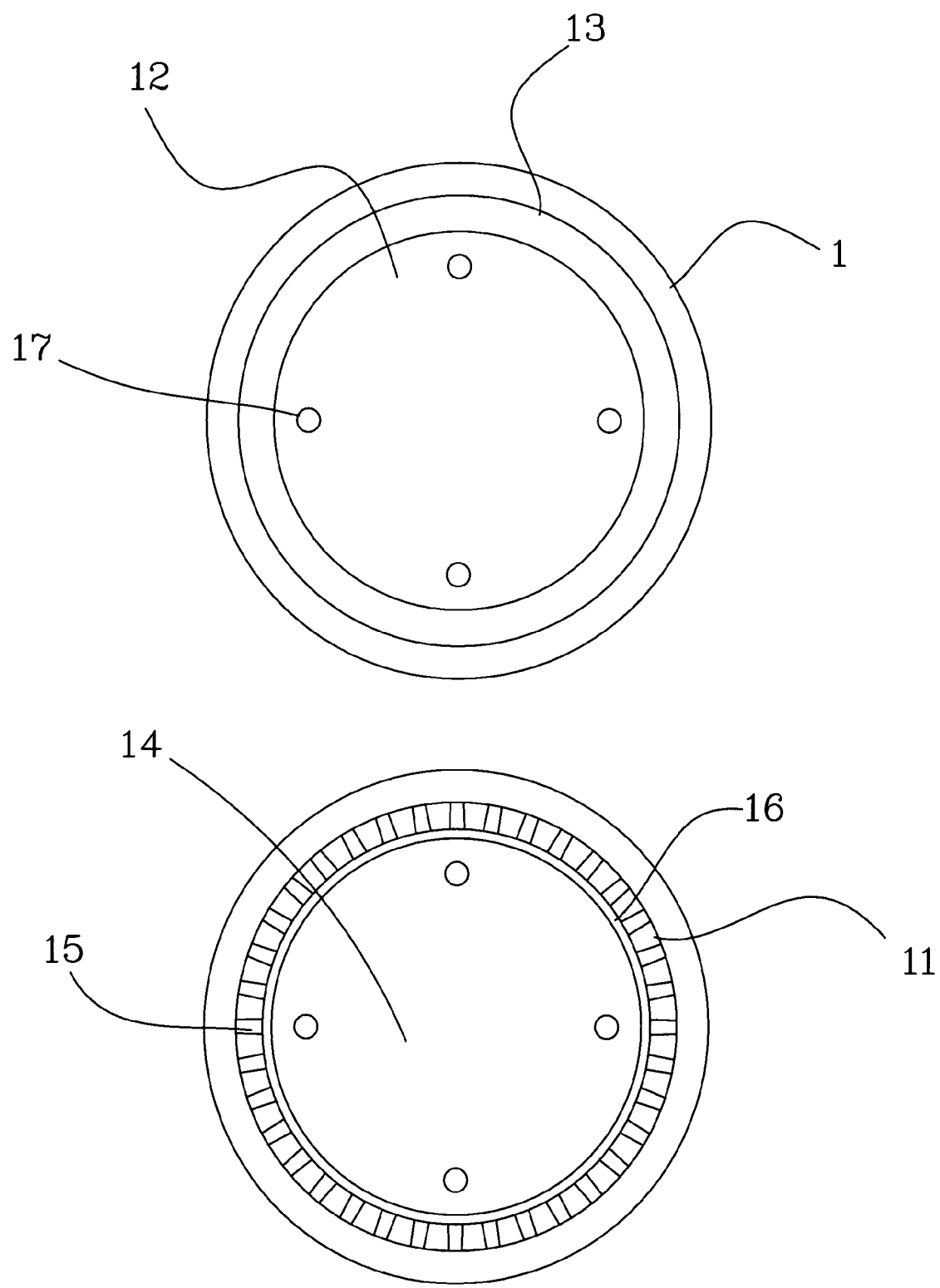
FIG. 2 is a top view and a bottom plain view of the thermal module in accordance with the present invention.
Figure 5:
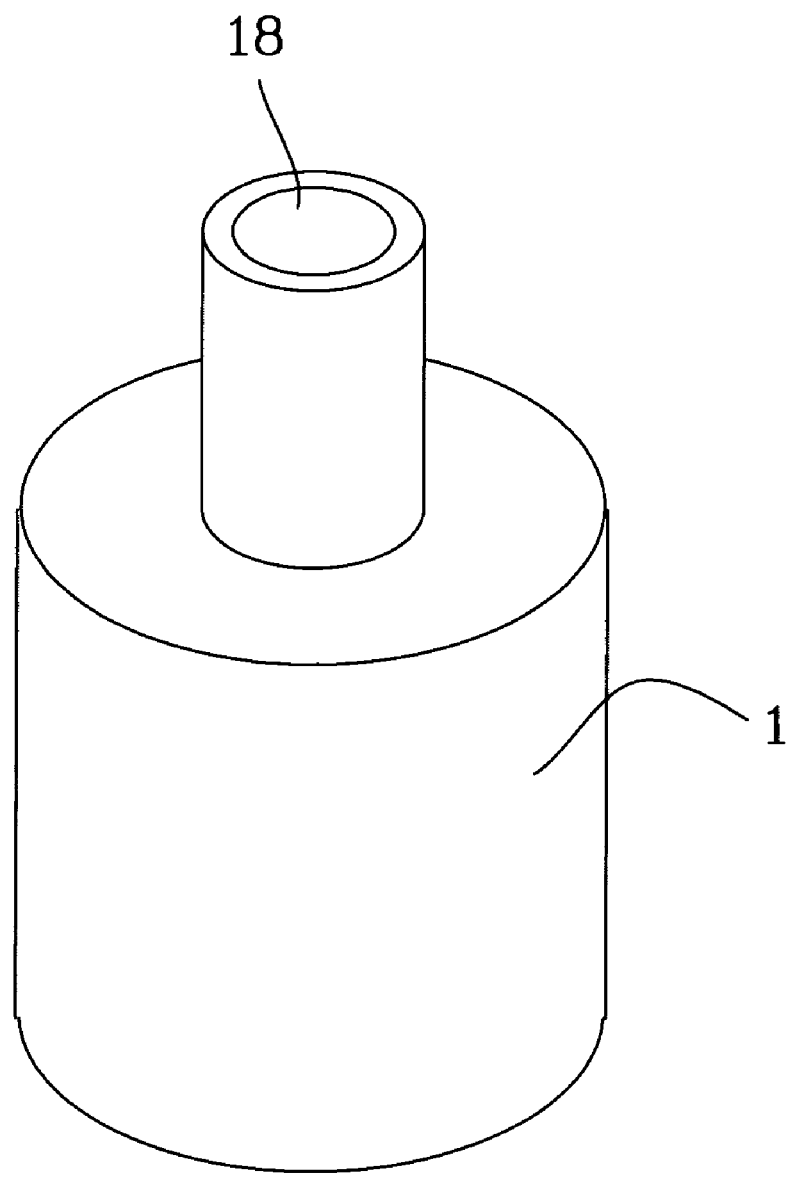
FIG. 5 is an oblique elevation of the thermal module shown in FIG. 4.

Referring to FIGS. 1~3, the body 1 can be made in any of a variety of shapes such as circular, oval, triangular, rectangular, polygonal, or streamline-like shape, having an opening 13 at the top side, and a base 14 at the bottom side, and radiation fins 15 spaced around the peripheral wall 11, and reinforcing ribs 16 at the bottom side of the body 1. The base 14 has a plurality of mounting through holes 17 spaced around the border area. According to an alternate form of the present invention as shown in FIGS. 4 and 5, the body 1 has an opening 13 at the top side, and a barrel 18 downwardly extending from the center of the bottom side of the base 14.

Before fabrication of the thermal module, a computer-added mold flow analysis is employed to design a mold subject to the shape of the thermal module to be made, and then the material property parameter obtained from the metal alloy to be used for molding the thermal module and related experience value are inputted into the computer, and then a computer simulation is run to predict the flow of the fluid state of the metal alloy in the die 3, and then the mold is modified subject to the computer simulation result. By means of this computer simulation, a high precision die 3 can be obtained, saving much cost for molding tool and shortening the delivery time.

Figure 6:
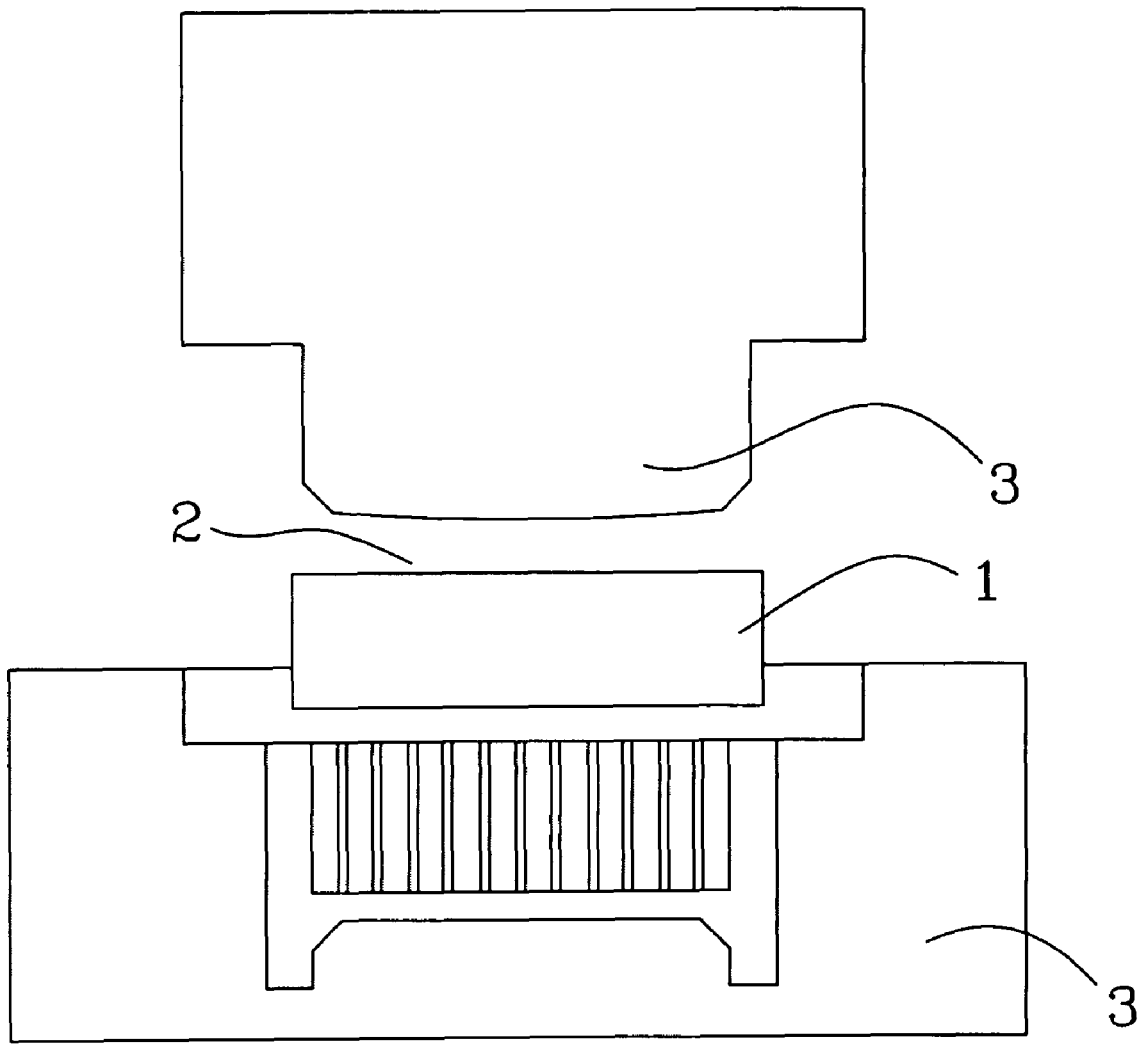
FIG. 6 is a schematic drawing showing the forging process during fabrication of the thermal module according to the present invention.

Referring to FIG. 6, the fabrication of the thermal module is performed subject to the result of the computer simulation analysis. During fabrication, prepared pastille shape magnesium alloy and copper alloy are softened with heat, and then softened magnesium alloy and copper alloy are put in the prepared forging die 3 and press-forged into shape. By means of press-forging, the fabrication of the thermal module is easy, and the yield rate is high.

Referring to FIGS. 3 and 4, the body 1 can be made having radiation fins 15 spaced around the peripheral wall 11, and reinforcing ribs 16 at the bottom side, and a contact surface member 2 bonded to the inside of the body 1. By means of press-forging, the cohesive energy density of the thermal module is high and can be washed with water, and therefore the thermal module can be covered with a layer of metal coating by means of electroplating, improving beauty and quality.

Figure 7:
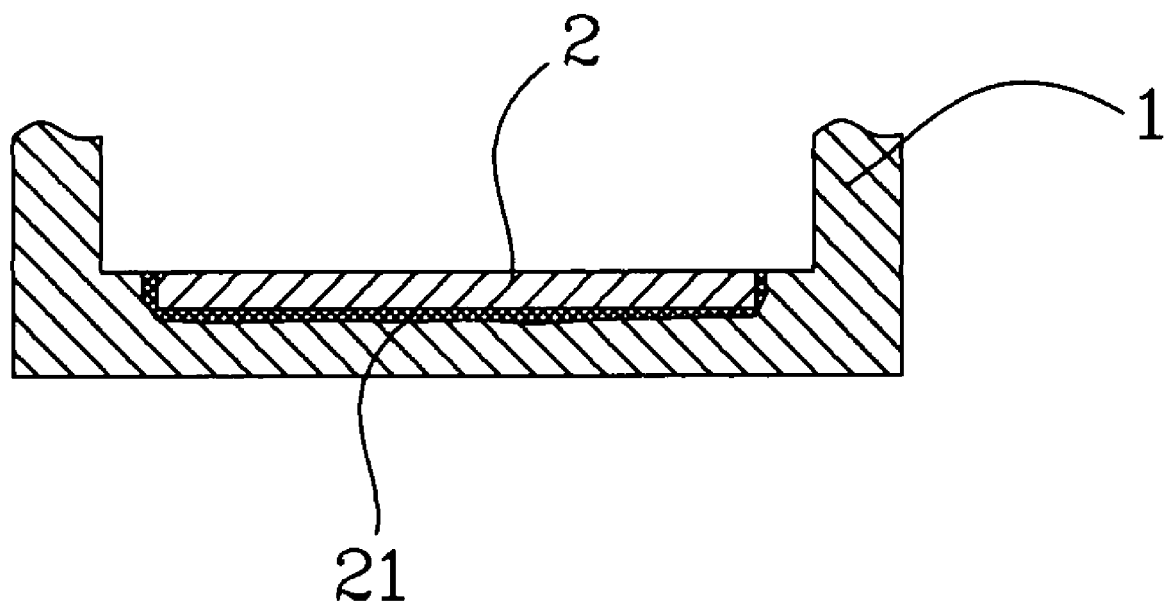
FIG. 7 is a sectional view of a part of the present invention, showing an eutectic structure grown between the body and the contact surface member.

Further, because magnesium alloy is inflammable and the fire point of magnesium alloy is about 600° C., the heating temperature must be well controlled to prevent a hazard. Preferably, prepared magnesium alloy is heated to about 200°~350° C., and prepared copper alloy is heated to about 200°~800° C. in excess of the fire point of magnesium alloy. When prepared magnesium alloy and prepared copper alloy are respectively heated to be softened and can be put in the forging die 3 and easily be forged into the desired shape and thickness. During press forging, copper alloy is forced into magnesium alloy to make heat exchange, causing the temperature of the magnesium alloy to be increased further, and therefore an eutectic structure 21 is grown between the body 1 and the contact surface member 2, as shown in FIG. 7. The heating procedure is performed subject to computer simulation so that the heating temperature can be controlled accurately during actual fabrication, preventing burning of magnesium alloy.

Referring to FIGS. 1~5, the thermal module thus made can be used in a LED module to dissipate heat from the LED module quickly. During installation, the contact surface member 2 is kept in close contact with the hot side of the LED module so that the contact surface member 2 transfers heat energy from the LED module to the body 1 rapidly for quick dissipation into the outside open air. Further, the thermal module provides a satisfactory magnetic wave shielding effect, practical for use in different electronic products that require EMI (electromagnetic interference) protection.

As stated above, the present invention fully utilizes the physical characteristics of magnesium alloy. A thermal module made out of magnesium alloy and high conductivity metal material by means of press forging has a smooth surface convenient for further surface treatment. By means of press-forging technology, the fabrication of thermal module is easy, and the yield rate is high. Further, a thermal module made according to the present invention is suitable for use with a LED module to dissipate heat. The heat dissipation efficiency of the present invention is superior to conventional thermal module designs.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A thermal module comprising:
    a body press-forged from magnesium alloy that is heated to a softened status, the body having a peripheral wall, an opening located at a first end, a base located at second end opposite the first end, and a recessed chamber defined by the peripheral wall and the base and communicating with the opening, the base having a plurality of mounting through holes extending through the base and spaced around a border of the base; and
    a contact surface member prepared from a high thermal conductivity metal material and bonded to the recessed chamber of the body during press-forging of the body.

2. The thermal module as claimed in claim 1, wherein the body has a plurality of radiation fins located on and extending outwardly from an exterior surface of the peripheral wall, and the body has at least one reinforcing rib extending downwardly from a bottom of the base.

3. The thermal module as claimed in claim 2, wherein the body has a shape selected from a group consisting of a circular, an oval, a triangular, a rectangular, and, a polygonal shape.

4. The thermal module as claimed in claim 2, wherein the contact surface member is tabular member prepared from copper alloy, the contact surface member is located in the recessed chamber and bonded to a top surface of the base of the body.

5. The thermal module as claimed in claim 1, further comprising a eutectic structure formed between the body and the contact surface member.

6. The thermal module as claimed in claim 2, wherein the contact surface member is circular member and made of a copper alloy, the contact surface member is located in the recessed chamber adjacent to the base and bonded to an interior surface of the peripheral wall of the body.

7. The thermal module as claimed in claim 2, wherein the body includes a barrel extending downwardly from a bottom of the base of the body.

8. A thermal module comprising:
a body press-forged from magnesium alloy that is heated to a softened status, the body having a peripheral wall, an opening located at a first end, a base located at second end opposite the first end, and a recessed chamber defined by the peripheral wall and the base and communicating with the opening,
a plurality of radiation fins located on and extending outwardly from an exterior of the peripheral wall, and the body has at least one reinforcing rib extending downwardly from a bottom of the base; and
a contact surface member made of a high thermal conductivity metal material and bonded to the recessed chamber of the body during press-forging of the body.

* * * * *